United States Patent
Sharma et al.

(10) Patent No.: US 9,792,175 B2
(45) Date of Patent: Oct. 17, 2017

(54) BAD COLUMN MANAGEMENT IN NONVOLATILE MEMORY

(71) Applicant: SanDisk Technologies LLC, Plano, TX (US)

(72) Inventors: Sahil Sharma, San Jose, CA (US); Abhijeet Manohar, Bangalore (IN); Mrinal Kochar, San Jose, CA (US); Yong Huang, San Jose, CA (US); Derek McAuley, San Jose, CA (US); Mikhail Palityka, Ontario (CA); Ivan Baran, San Jose, CA (US); Aaron Lee, Mountain View, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 37 days.

(21) Appl. No.: 14/919,363

(22) Filed: Oct. 21, 2015

(65) Prior Publication Data
US 2017/0116076 A1 Apr. 27, 2017

(51) Int. Cl.
*G11C 29/00* (2006.01)
*G06F 11/10* (2006.01)
*G11C 29/52* (2006.01)

(52) U.S. Cl.
CPC .......... *G06F 11/1068* (2013.01); *G11C 29/52* (2013.01)

(58) Field of Classification Search
CPC .. G06F 11/1068; G06F 11/1012; G11C 29/52; G11C 29/44; G11C 29/78; G11C 29/72; G11C 2029/0405; G11C 16/10; G11C 29/82; G11C 29/765; H04N 17/002; H04N 5/335
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,661,053 A | 8/1997 | Yuan | |
| 5,768,192 A | 6/1998 | Eitan | |
| 5,903,495 A | 5/1999 | Takeuchi et al. | |
| 6,011,725 A | 1/2000 | Eitan | |
| 6,046,935 A | 4/2000 | Takeuchi et al. | |
| 6,222,762 B1 | 4/2001 | Guterman et al. | |
| 7,170,802 B2 | 1/2007 | Cernea et al. | |
| 7,447,066 B2 | 11/2008 | Conley et al. | |
| 7,904,783 B2 | 3/2011 | Brandman et al. | |
| 8,885,426 B1 | 11/2014 | Burstein et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

*Primary Examiner* — Guerrier Merant
(74) *Attorney, Agent, or Firm* — Foley & Lardner LLP

(57) ABSTRACT

When the number of bad columns in a memory or plane is less than a threshold number then a first Error Correction Code (ECC) scheme encodes user data in first pages of a first size. If the number of bad columns is greater than the threshold number then a second ECC scheme encodes the user data in second pages of a second size that is smaller than the first size.

20 Claims, 16 Drawing Sheets

(56) References Cited

U.S. PATENT DOCUMENTS

| | | | |
|---|---|---|---|
| 2007/0103978 A1* | 5/2007 | Conley | G11C 16/0483 |
| | | | 365/185.09 |
| 2009/0103379 A1 | 4/2009 | Zhang et al. | |
| 2009/0241009 A1* | 9/2009 | Kong | G06F 11/1072 |
| | | | 714/763 |
| 2010/0115376 A1 | 5/2010 | Shalvi et al. | |
| 2011/0002169 A1 | 1/2011 | Li et al. | |
| 2012/0079355 A1 | 3/2012 | Patapoutian et al. | |
| 2014/0157087 A1* | 6/2014 | Yurzola | G06F 11/1068 |
| | | | 714/773 |

* cited by examiner

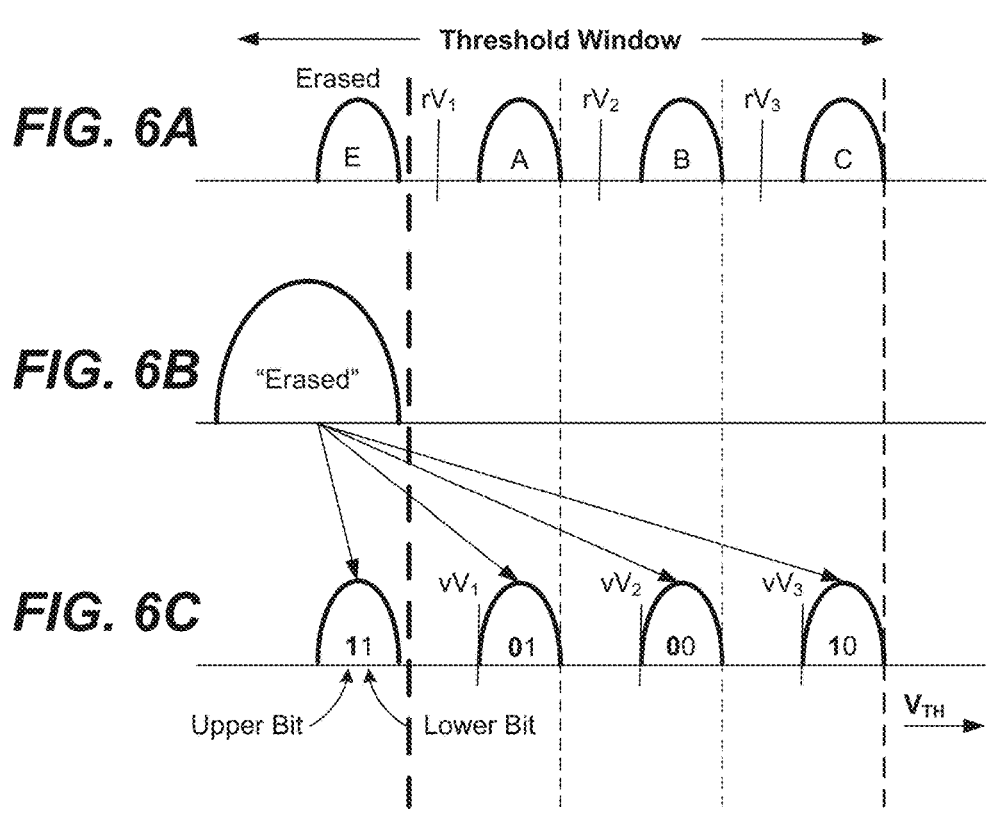
Programming into four states represented by a 2-bit code

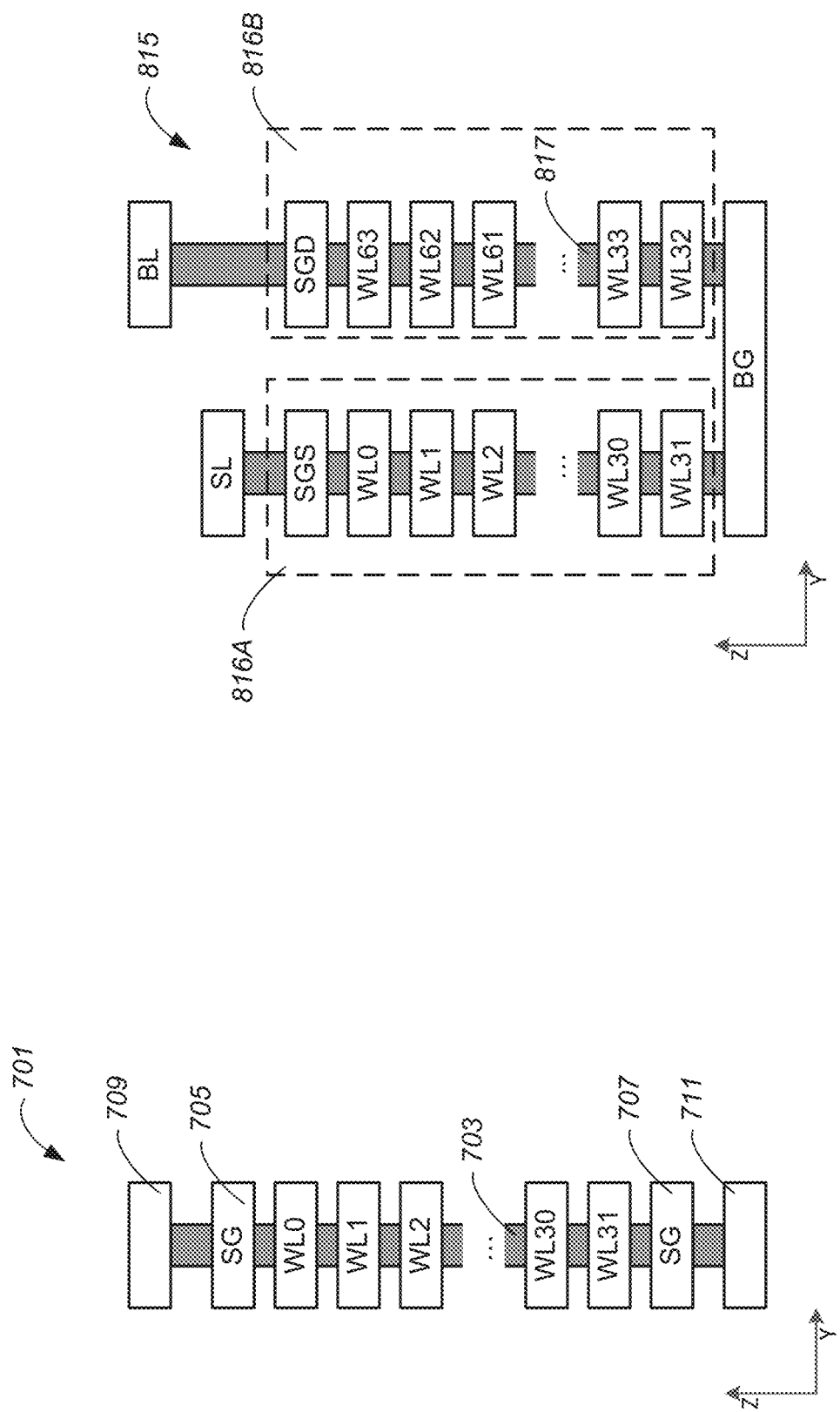

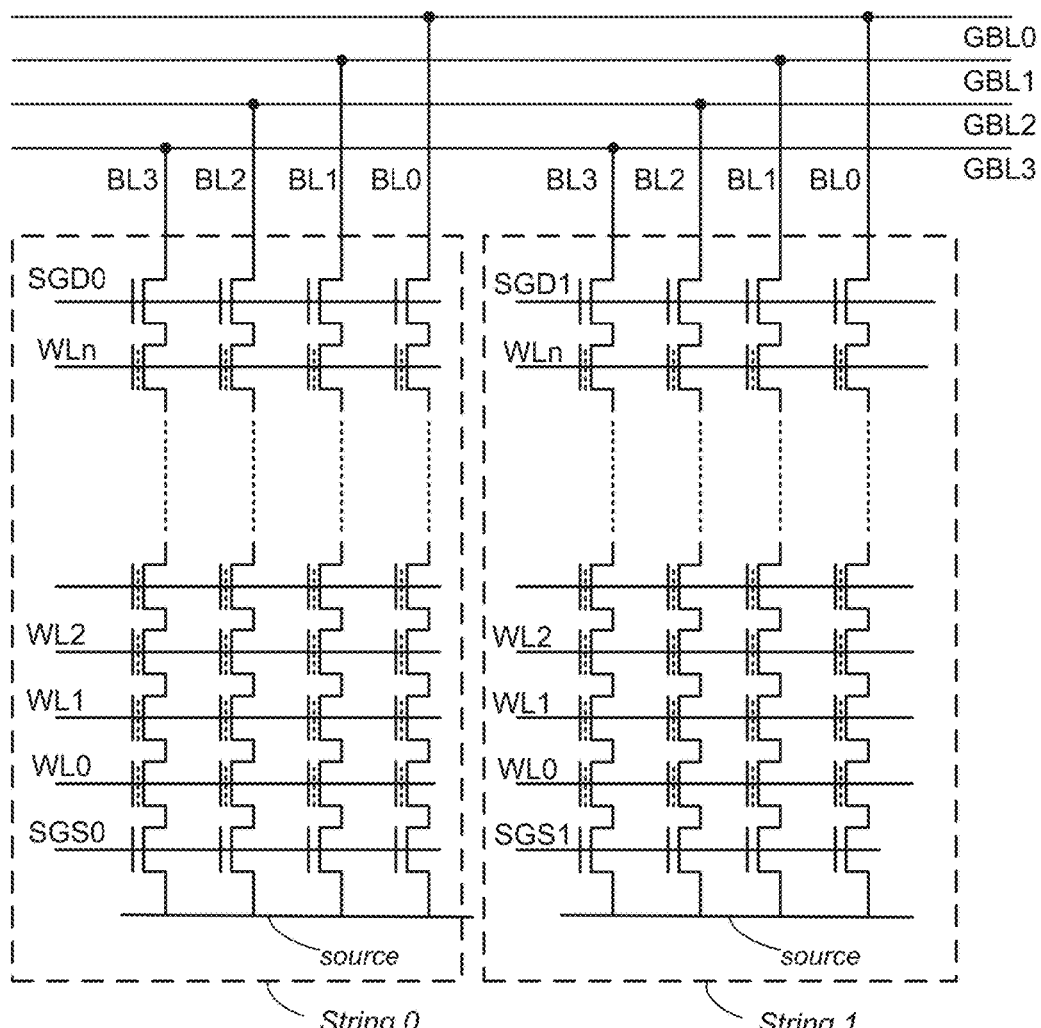
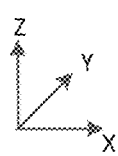
FIG. 10B

FIG. 13A
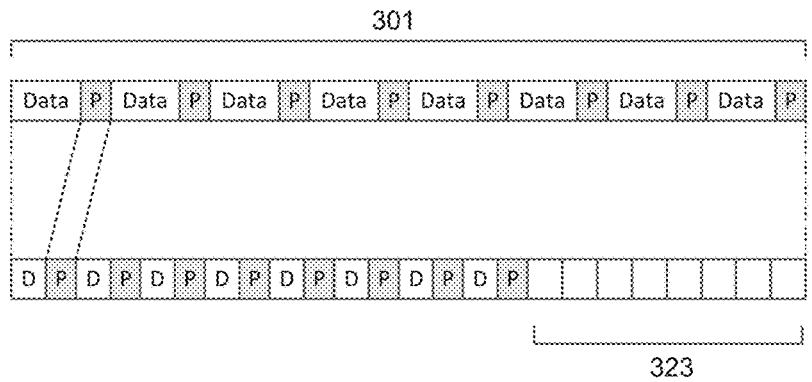
FIG. 13B
FIG. 14
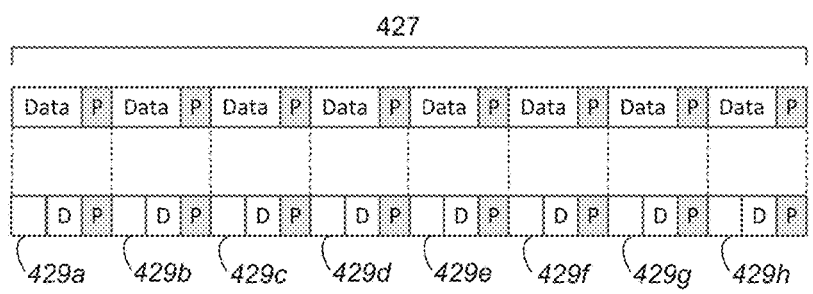
FIG. 15

BAD COLUMN MANAGEMENT IN NONVOLATILE MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

In a nonvolatile memory, defective bit lines may be replaced with spare bit lines. This may be done on a column-by-column basis where a column includes multiple bit lines. If the number of bad columns or bad bit lines exceeds the number of spare columns or spare bit lines, then some bad columns or bad bit lines are not replaced. If the number of unreplaced bad columns or bad bit lines results in a bit error rate that exceeds the correction capability of an Error Correction Code (ECC) scheme then the block may be considered a bad block and may not subsequently be used to store user data. In some cases, rather than discard such a block, a second ECC scheme that encodes a smaller page (e.g. half the size used in the first ECC scheme) may be applied to data stored in the block. Storing the same number of ECC pages, with each page being smaller, results in unused space. Used space may be arranged primarily along good columns or bit lines. Keeping the number of parity bytes the same in the second ECC scheme as in the first ECC scheme results in a higher redundancy ratio, and thus a higher error correction capacity, for data encoded according to the second ECC scheme. Thus, a block with data encoded according to the second ECC scheme may be usable even where the number of unreplaced bad columns or bad bit lines would cause data encoded according to the first ECC scheme stored in the block to have a bit error rate that would be uncorrectable using the first ECC scheme.

An example of a method of operating a nonvolatile memory includes: detecting a number of bad columns in the nonvolatile memory; comparing the number of bad columns detected by the detecting with a threshold number; if the number of bad columns is less than the threshold number then applying a first Error Correction Code (ECC) scheme to user data to be stored in the nonvolatile memory, the first ECC scheme encoding user data in first pages of a first size; and if the number of bad columns is greater than the threshold number then applying a second ECC scheme to user data stored in the nonvolatile memory, the second ECC scheme encoding user data in second pages of a second size that is smaller than the first size.

Encoding according to the first ECC scheme may add a number of parity bytes per first page of user data and encoding according to the second ECC scheme may add the number of parity bytes per second page of user data. A page of the first size may have twice as many bytes as a page of the second size. The first size may be about two thousand bytes and the second size may be about a thousand bytes. The method of claim 1 wherein the first size is about two thousand bytes and the second size is about five hundred bytes. In response to the comparing, a configurable ECC encoder/decoder unit that is connected to the nonvolatile memory may be configured to apply the first ECC scheme to user data if the number of bad columns is less than the threshold number and to apply the second ECC scheme to user data if the number of bad columns is greater than the threshold number. If the number of bad columns is greater than the threshold number, a determination may be made as to whether data to be stored is user data or control data, the second ECC scheme may be applied to user data, and the first ECC scheme may be applied to control data. Control data may be stored in single-level cell (SLC) format, with one bit per memory cell, and user data may be stored in multi-level cell (MLC) format, with more than one bit per memory cell. If the number of bad columns is less than the threshold number, then a first user data storage capacity may be applied to individual blocks of the nonvolatile memory; and if the number of bad columns is greater than the threshold number, then a second user data storage capacity may be assigned to the individual blocks of the nonvolatile memory, the second user data storage capacity being smaller than the first user data storage capacity. The second user data storage capacity may be about half as much as the first user data storage capacity.

An example of a nonvolatile memory system includes: an array of nonvolatile memory cells; and a configurable Error Correction Code (ECC) encoder/decoder that has at least a first mode and a second mode, the first mode encoding pages of a first size prior to storage in the array of nonvolatile memory cells and the second mode encoding pages of a second size prior to storage in the array of nonvolatile memory cells, the second size being smaller than the first size.

The array of nonvolatile memory cells may include a plurality of individually erasable blocks including a first block that stores control data, encoded in the first mode, in single-level cell (SLC) format, and a second block that stores user data, encoded in the second mode, in multi-level cell (MLC) format. The first block may contain pages of the first size stored with a predetermined number of parity bytes per page and the second block may contain pages of the second size stored with the predetermined number of parity bytes per page. Encoded control data stored in the first block may occupy substantially all memory cells along a written word line and encoded user data stored in the second block may occupy substantially less than all memory cells along a written word line. Memory cells along the written word line of the second block that are not occupied by encoded user data may be padded with dummy data. A record may indicate a maximum number of defective columns in the array of nonvolatile memory cells that were identified as bad and are replaced or skipped, additional columns in the array of nonvolatile memory cells that were identified as bad may remain unrecorded and not replaced. The array of nonvolatile memory cells may be a three dimensional array that is monolithically formed in one or more layers of memory cells disposed above a silicon substrate.

An example of a method of operating a nonvolatile memory includes: testing columns of the nonvolatile memory to detect bad columns; replacing bad columns up to a maximum replaceable number; comparing a number of unreplaced bad columns detected by the testing with a threshold number; if the number of unreplaced bad columns is less than the threshold number: applying a first Error Correction Code (ECC) scheme to user data to be stored in the nonvolatile memory, the first ECC scheme encoding data in pages of a first size; storing n encoded pages of the first size per word line; if the number of unreplaced bad columns is greater than the threshold number: applying a second ECC scheme to user data to be stored in the nonvolatile memory, the second ECC scheme encoding data in pages of a second size; and storing n encoded pages of the second size per word line.

Storing the n encoded pages of the first size per word line may use substantially all memory cells of a first word line, storing the n encoded pages of the second size per word line may not use substantially all memory cells along a second word line. Unused memory cells along the second word line may be programmed with dummy data. If the number of unreplaced bad columns is greater than the threshold number, a determination may be made as to whether data to be stored in the nonvolatile memory is user data or control data, and the first ECC scheme may be applied to control data. The nonvolatile memory may be a three dimensional memory that is monolithically formed in one or more physical layers of memory cells having active areas disposed above a silicon substrate, and each bad column may include one or more horizontal bit lines, each horizontal bit line connected to a plurality of vertical bit lines.

Various aspects, advantages, features and embodiments are included in the following description of exemplary examples thereof, which description should be taken in conjunction with the accompanying drawings.

BRIEF DESCRIPTION OF THE DRAWINGS

FIGS. 6A-6C illustrate an example of programming a population of memory cells.

FIG. 7 shows an example of a physical structure of a 3-D NAND string.

FIG. 8 shows an example of a physical structure of a U-shaped 3-D NAND string.

FIGS. 10A-C illustrate an example of a 3-D NAND memory with multiple separately-selectable sets of strings in a block.

FIGS. 13A-B show examples of different sized ECC pages in a physical page of a memory.

FIG. 14 shows evenly distributed unused space in a physical page.

FIG. 15 shows an example of adaptively distributed unused space in a physical page.

DETAILED DESCRIPTION

Memory System

Figure 1:
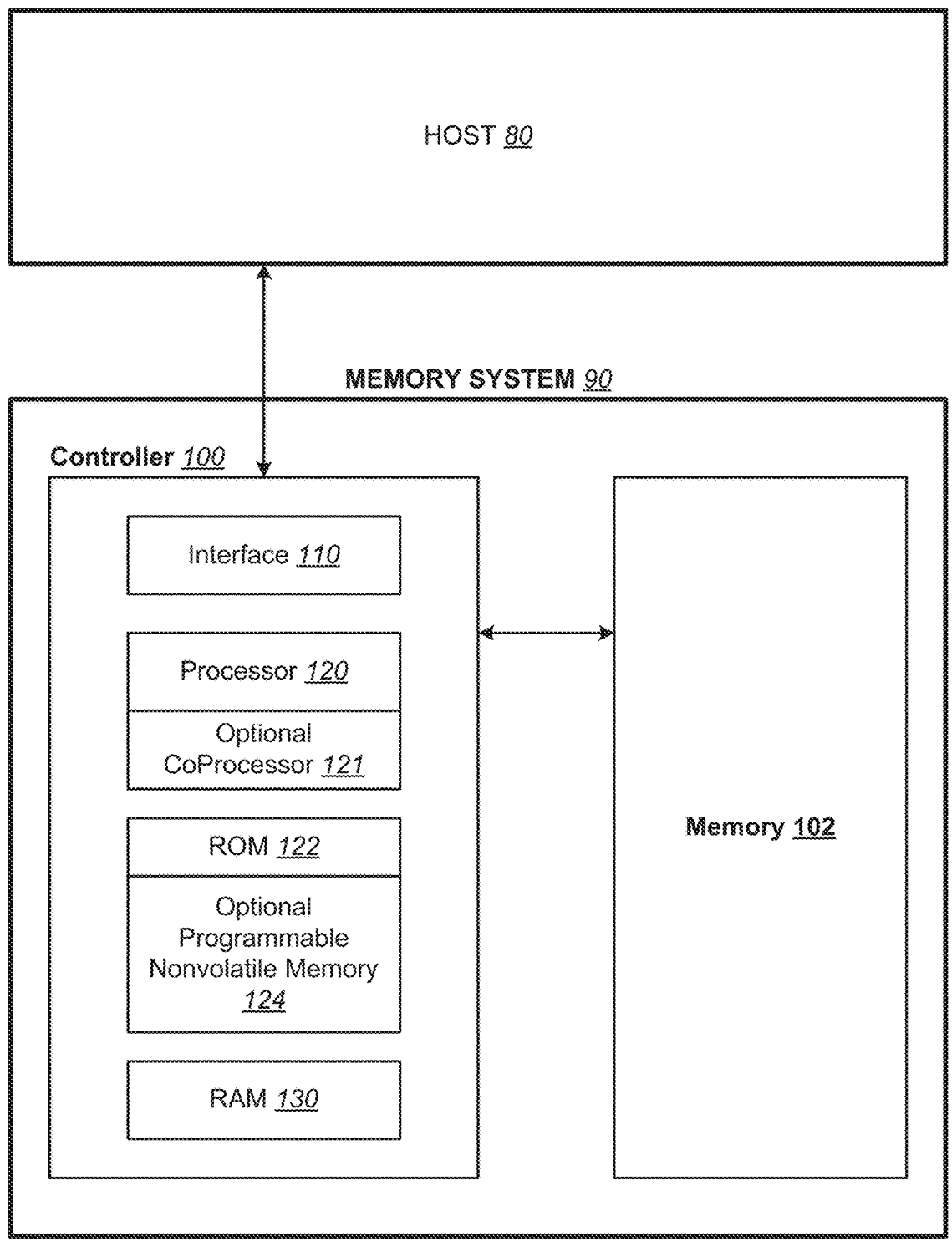
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
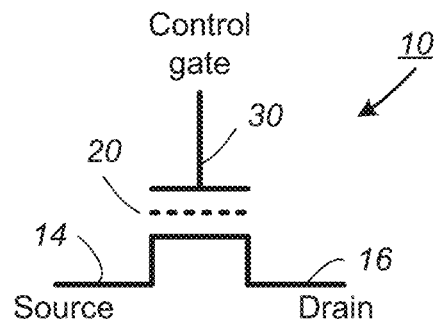
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
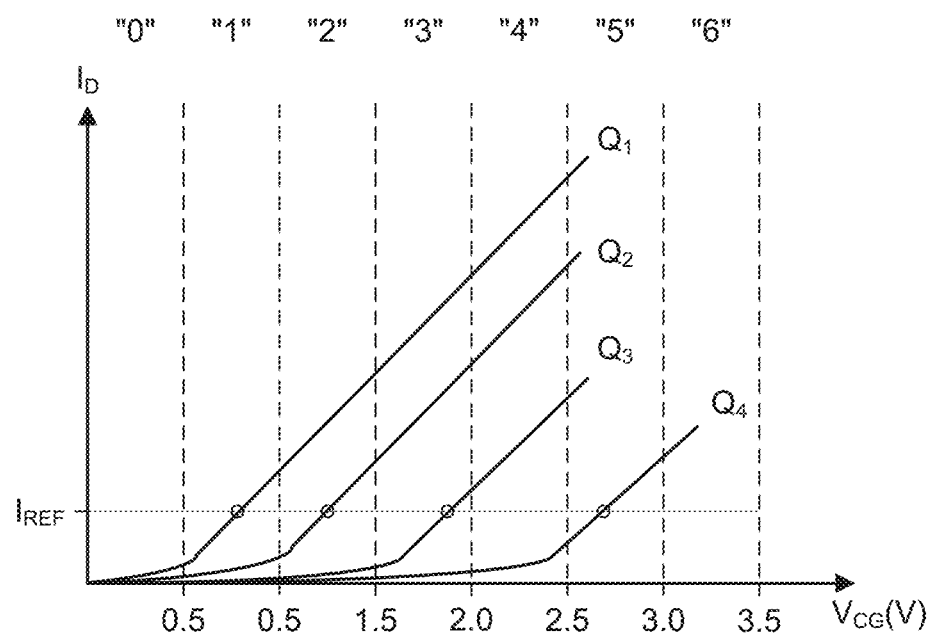
FIG. 3 illustrates the relation between the source-drain current $I_D$ and the control gate voltage $V_{CG}$ for four different charges Q1-Q4 that a floating gate may store.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states "0", "1", "2", "3", "4", "5", "6", and an erased state (not shown) may be demarcated by partitioning the threshold window into regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
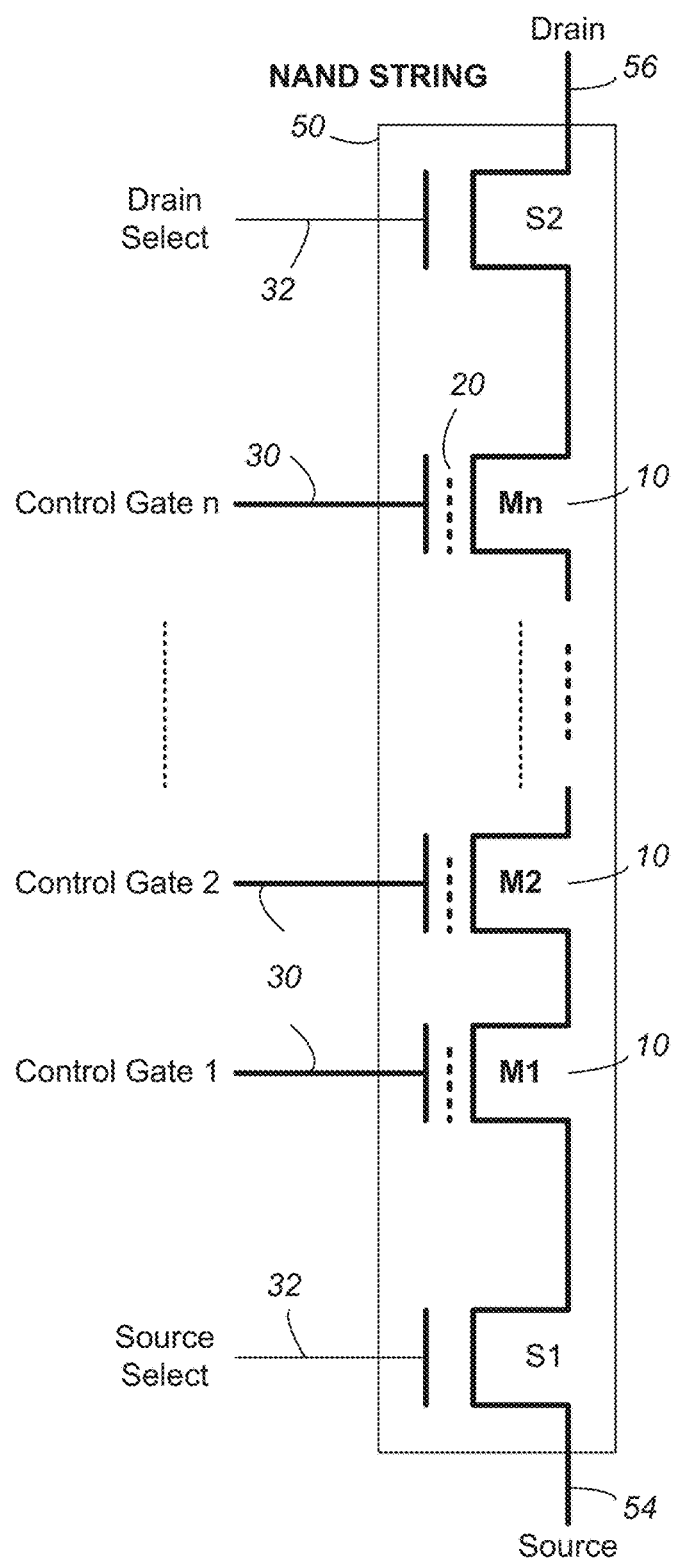
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
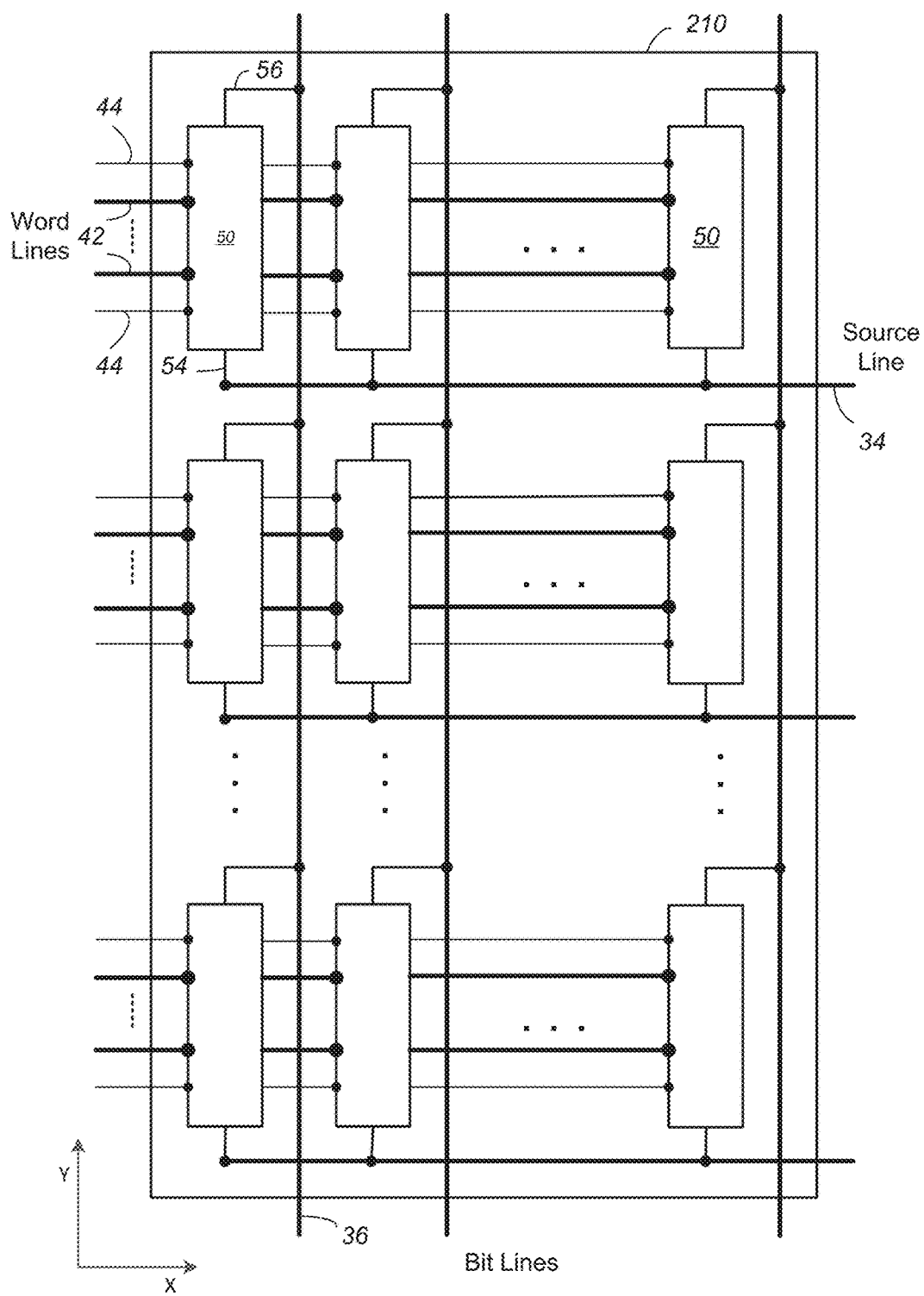
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
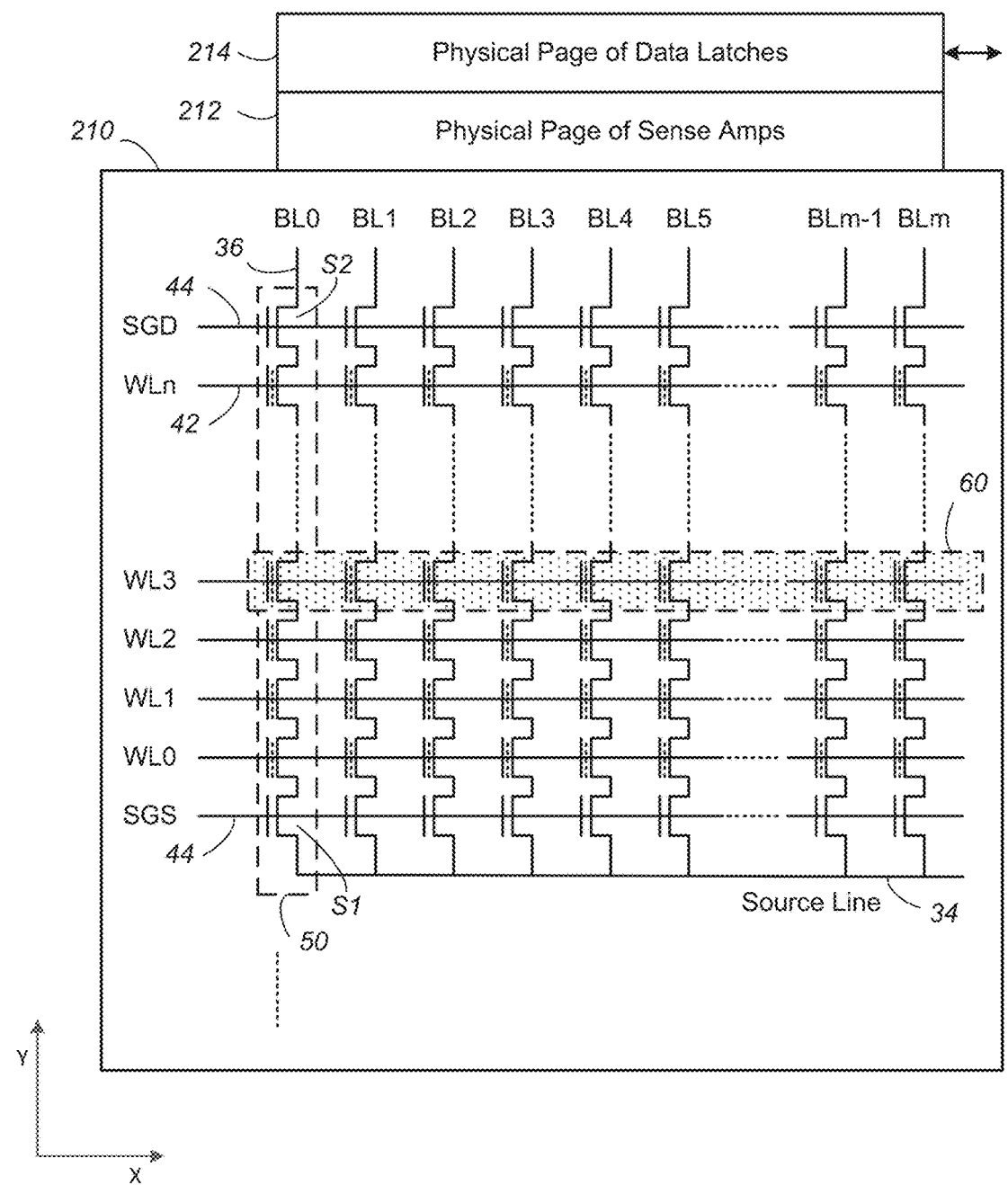
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
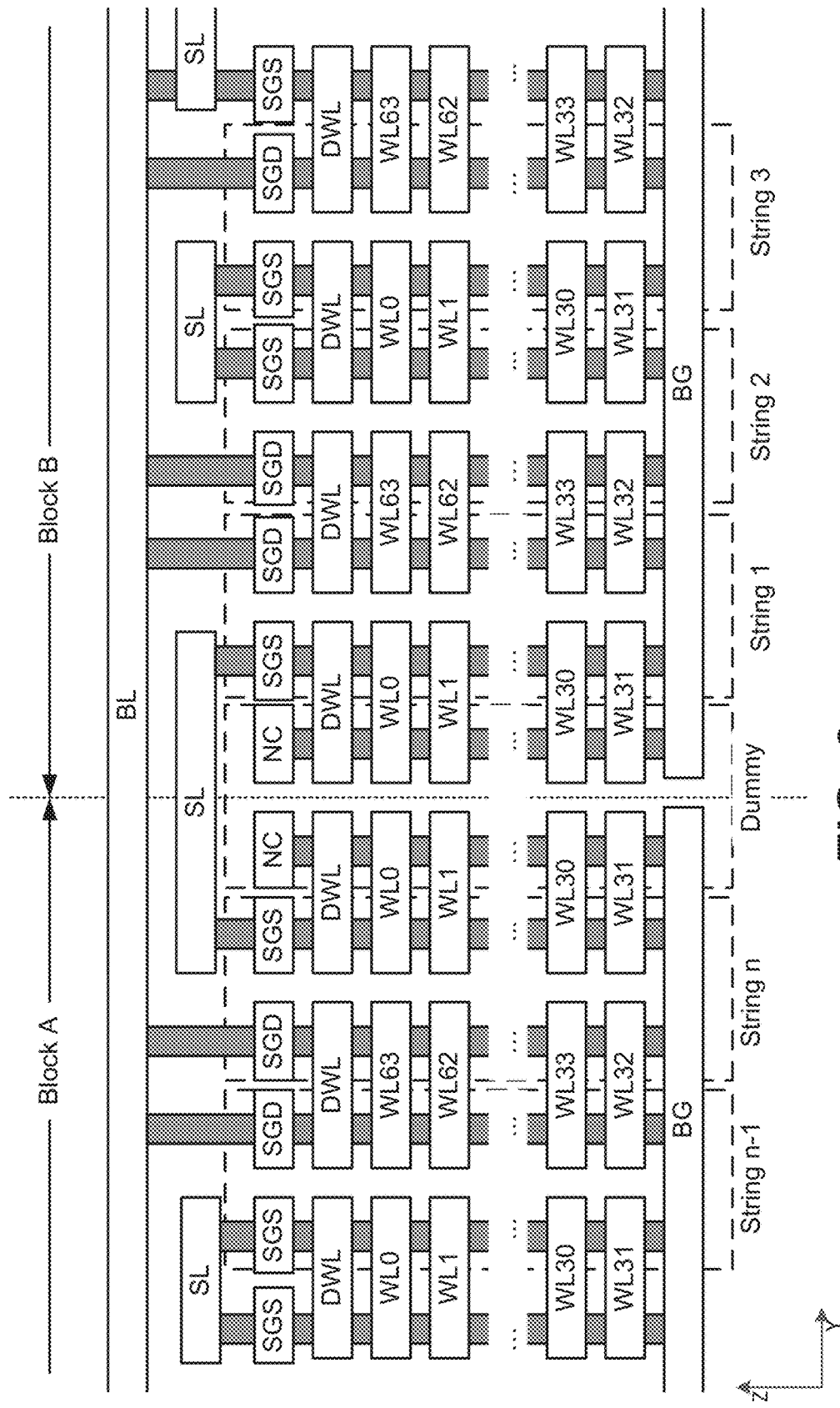
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n separately-selectable sets of strings (String 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10A:
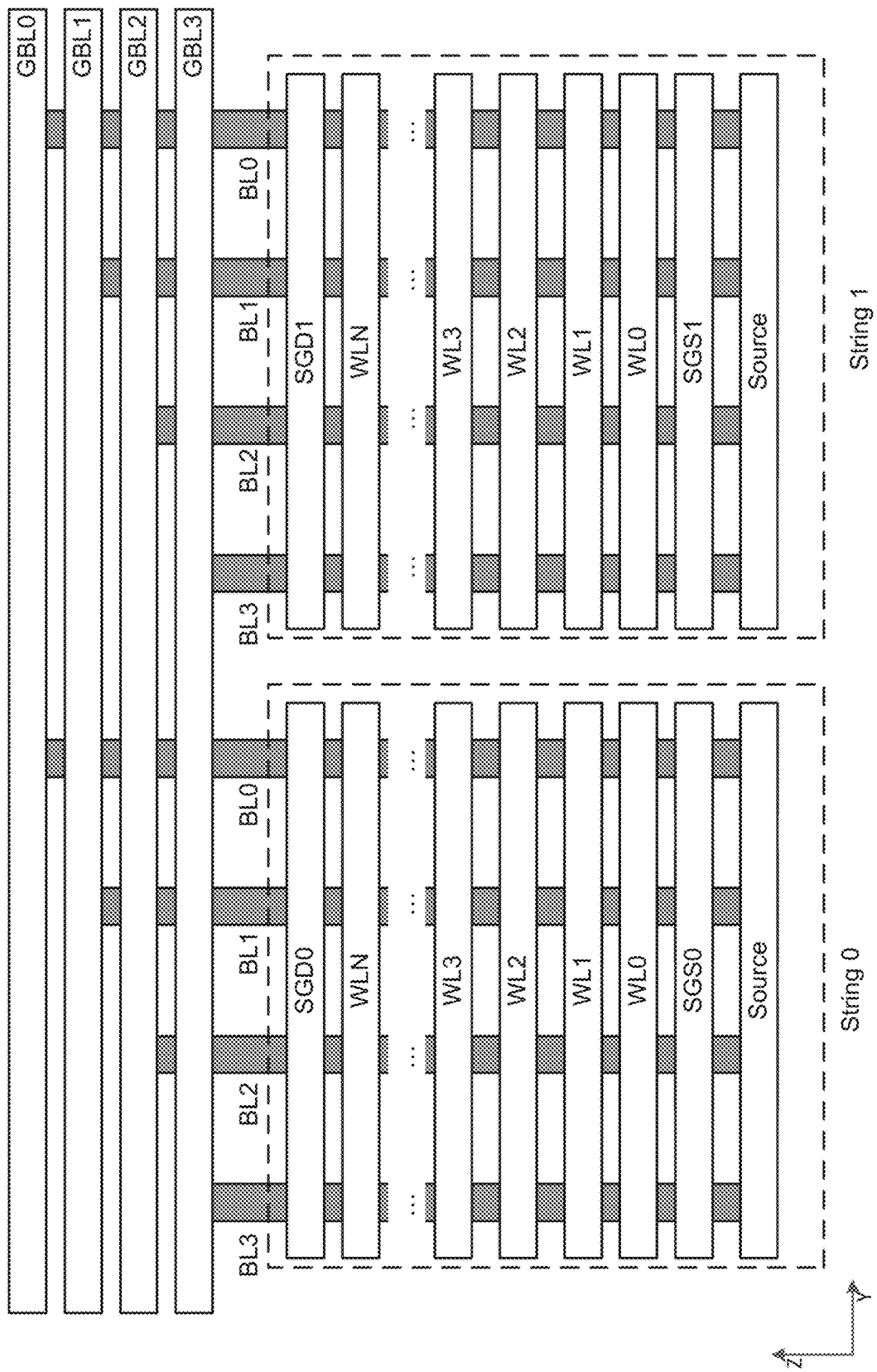

FIG. 10A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 10A shows only portions of GBL0 GBL3, and that these bit lines extend further in the y-direction and may connect with additional NAND strings in the block and in other blocks. Furthermore, additional bit lines extend parallel to GBL0 GBL3 (e.g. at different locations along x-axis, in front of, or behind the location of the cross-section of FIG. 10A).

FIG. 10B illustrates separately-selectable sets of NAND strings of FIG. 10A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 10C:
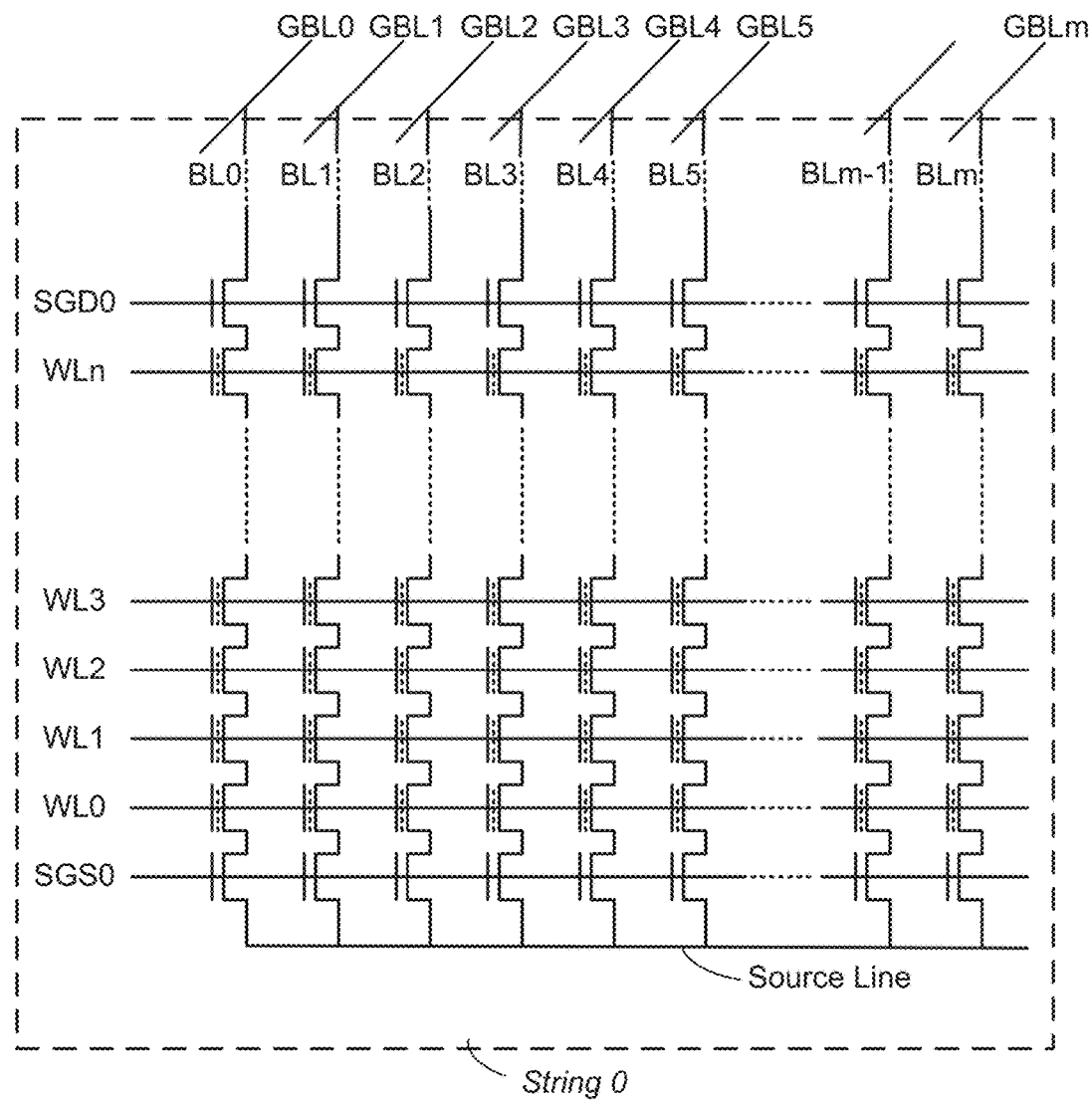

FIG. 10C shows a separately selectable set of NAND strings, String 0, of FIGS. 10A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Bad Blocks and Bad Bit Lines

In some memory systems, bad blocks (e.g. blocks in planar or 3D NAND memory arrays) are detected and are marked so that they are not subsequently used for storage of user data. For example, detection and marking of bad blocks may be performed during factory testing. A bad block may be a block that fails to meet a set of criteria related to, for example, reading, writing, and erasing (e.g. failing to read, write, or erase within time limit), having an excessively high error rate or an excessive number of bad cells, and/or other criteria. If a particular die has more than a threshold number of bad blocks then the die may be discarded. In some cases, dies may be classified according to the number of bad blocks that they contain. Generally, dies with fewer bad blocks are preferable because data storage capacity of the memory is reduced by the number of bad blocks. Blocks in 3D memories may be large so that significant capacity may be lost when even a small number of blocks are bad.

In some cases, blocks may have some inoperable components while other components remain operable. For example, one or more bit lines in a block may be found to be inoperable and may be replaced with spare bit lines. In some examples, bit lines are grouped into columns where a column includes a number of bit lines (e.g. 4, 8, 16, 32, or some other number). A column may be replaced as a unit when it is found to contain at least one bad bit line. The large size and complexity of 3D memories may result in relatively large numbers of bad bit lines in some cases. This may exceed the number of replacement bit lines or columns so that some bad bit lines cannot be replaced. A relatively small number of unreplaced bad bit lines may be acceptable where the resulting errors are within the error correction capability of an Error Correction Code (ECC) scheme that encodes data prior to storage and decodes the data after storage. A larger number of unreplaced bad bit lines may result in data that is uncorrectable by ECC (UECC). When data from a block is UECC then the block may be designated as a bad block and may not subsequently be used to store data.

Figure 11A:
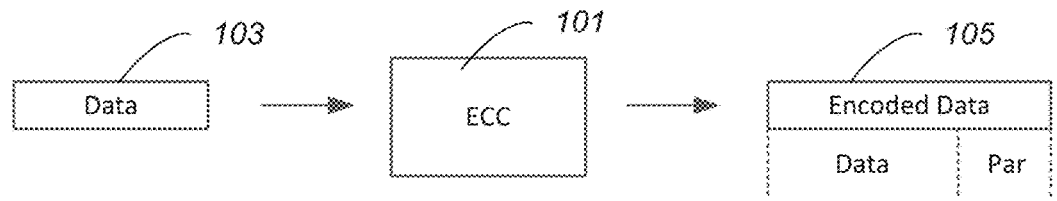
FIGS. 11A-B illustrate ECC encoding and decoding.

FIG. 11A shows an example of ECC encoding. An ECC engine 101 (ECC encoder/decoder) receives a page of user data 103. The ECC engine 101 then encodes the page of user data to generate a portion of encoded data 105 (sometimes referred to as a "codeword"). The portion of encoded data 105 is larger than the page of user data 103 because it includes a number of bytes of parity data ("Par"). For example, a page of user data may be about 2 KB (e.g. 2048 Bytes) and encoding may add 230 Bytes of parity data. (Some header information may also be encoded with the user data but is generally small and is not separately illustrated here.) It will be understood that while FIG. 11A illustrates data and parity bytes separated by a dotted line, parity bytes are not necessarily separate data that is appended to user data. Encoding may transform user data and combine it with parity data rather than simply appending parity data to user data. In a memory system, user data (e.g. data received by the memory system from a host) may be encoded prior to storage in a nonvolatile memory.

Figure 11B:
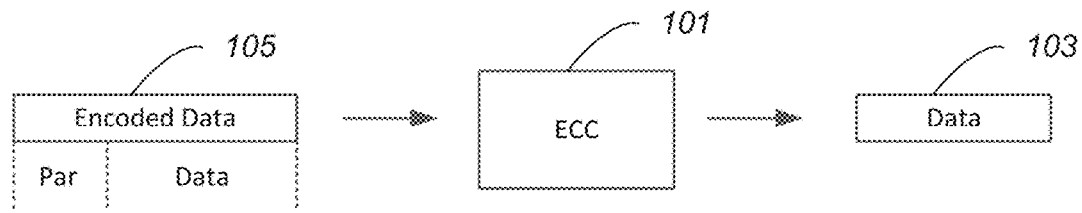

FIG. 11B shows an example of ECC decoding, in which encoded data 105 is decoded. For example, previously stored encoded user data may be read from a nonvolatile memory and may be decoded prior to being sent to a host. The ECC engine 101 uses parity data to identify and correct errors up to some limit that generally depends on the ECC scheme used and the amount of parity data added (redundancy ratio). The ECC engine thus returns a corrected copy of the page of user data 103. In general, more parity data provides greater error correction capability.

Figure 12:
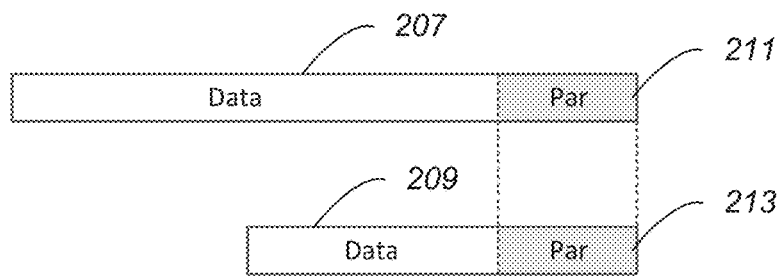
FIG. 12 illustrates an example of different ECC page sizes.

In some cases, the size of an ECC page may be reduced to provide a higher redundancy ratio and thus a greater error correction capability. For example, FIG. 12 shows an example including a first page 207 of a first size and a second page 209 of a second size that is smaller than the first size (about half the size in this case). For example, first page may be about 2 Kbytes and second page may be about 1 Kbyte. Both pages are encoded with the same amount of parity data (parity data 211 and parity data 213) in this example (e.g. 230 Bytes each). In other examples, there may be some difference in the amount of parity data generated. While first page 207 is twice the size of second page 209 in this example, other ratios may be applied. For example a first page might be four times the size of a second page (e.g. 2 Kbytes and 500 Bytes respectively). In some cases, a range of different ratios may be applied in a memory system. Ratios are not necessarily limited to integer multiples.

Where data is encoded in pages of a first size in a first ECC scheme, changing to encoding in pages of a smaller size in a second ECC scheme while keeping the parity data the same may have several results. The redundancy ratio is increased. For example, where the first ECC scheme may be capable of identifying and correcting a number of bad bits per first page (e.g. 122 bits per 2 Kbyte page) the second ECC scheme may be capable of identifying and correcting a similar number of bad bits per second page (e.g. 122 bits per 1 Kbyte page). Also, the amount of space occupied by each encoded page is smaller (e.g. from about 2.2 Kbytes to 1.2 Kbytes). Thus, if the number of encoded pages in a physical portion of the memory is the same in both schemes, then data encoded according to the second ECC scheme occupies significantly less space and thus leaves significant unused space in a given portion of memory.

FIGS. 13A-B illustrates data that is encoded in different ECC page sizes. FIG. 13A illustrates data encoded according to a first ECC scheme with a first ECC page size so that eight pages of encoded data equals capacity of a physical page 321 in a nonvolatile memory. A default ECC scheme and a memory page size may be selected so that encoded data fully occupies a page without leaving unused space. Thus, data is efficiently stored and memory space is not wasted.

FIG. 13B illustrates data ("D") that is encoded according to a second ECC scheme with a second page size that is about half the size of the first page size while the amount of parity data ("P") is the same. Because the number of encoded pages is the same as in FIG. 13A (i.e. both show eight encoded pages), and each page is smaller, there is significant unused capacity 323 in a physical page. For example, where first ECC page size is about 2 Kbytes and second ECC page size is about 1 Kbyte, a physical page that stores eight ECC encoded pages of the second page size has about 8 Kbytes of unused space (i.e. each of the eight pages occupies 1 Kbyte less space). In some examples, unused space is simply not accessed and memory cells in unused space may remain in an erased state. In some cases, unused space may be conditioned in some way, for example by padding user data so that unused cells are programmed with some dummy data or otherwise have some charge added which may reduce interaction between used cells and unused cells.

Various arrangements of data in a physical page are possible when storing smaller encoded pages. FIG. 14 shows a first arrangement in which second encoded pages (below) are stored at the same locations as first encoded pages (above) so that unused space 429a-h is evenly distributed across the physical page 427. In some memories, unreplaced bad columns may be randomly distributed across a physical page. An even distribution of used and unused space as shown in FIG. 14 may be appropriate. In general, some of the unreplaced bad columns will coincide with unused portions of the page so that the number of bad bits in the data is reduced accordingly (i.e. by reducing the space used by nearly half, the number of unreplaced bad columns used may be reduced by nearly half).

In some memory systems, a block, plane, or other unit that has a number of bad columns or bad bit lines that exceeds a threshold may be reconfigured from a default ECC page size to a smaller page size. In some memory systems, some portions may operate with a larger ECC page size while other portions operate with smaller ECC page size. In some memories, a range of different ECC page sizes may be used.

In some memories, user data from a host (data send in a host write command) and control data used by a memory controller (e.g. controller firmware and various data used by a controller) may be stored differently. For example, control data may be encoded and stored in a default ECC page size while user data is encoded and stored with a smaller page size. In some eases, control data is stored as SLC data while user data is stored as MLC data. Generally, this reduces the number of errors in control data so that control data may be encoded in a larger ECC page than user data.

In some examples, bad columns or bad bit lines may be concentrated and not randomly distributed. Used and unused areas may be assigned accordingly. FIG. 15 shows an example where an area 531 in a physical page 532 is identified as containing a concentration of bad columns and substantially unused portions 533 of the page are arranged accordingly so that area 531 falls in unused area 533. Used areas are thus in portions of physical page 532 where there may be a relatively low incidence of bad columns.

In some cases, bad columns may vary in the number of bad bit lines they contain. In such cases, bad columns may be ranked according to the number of bad bit lines they contain. Columns with high numbers of bad hit lines may be replaced (i.e. swapped out for spare columns) while columns with lower numbers of bad bit lines may remain unreplaced. Unused areas may be allocated where there are concentrations of bad columns and/or areas of bad columns with more bad bit lines than elsewhere. Thus, by ranking bad columns, some bad columns may be swapped out (replaced), other bad columns may be skipped, and some bad columns may be used to store user data (e.g. with high redundancy ratio).

Replacement of bad columns may occur after used and unused areas are assigned. In this case, bad columns may only be replaced in used areas so that the limited supply of replacement columns is efficiently used. Given the reduced number of bad columns that may be found in the used area, there may be significantly fewer unreplaced bad columns in the used area when replacement is exclusively directed to the used portion.

Figure 16:
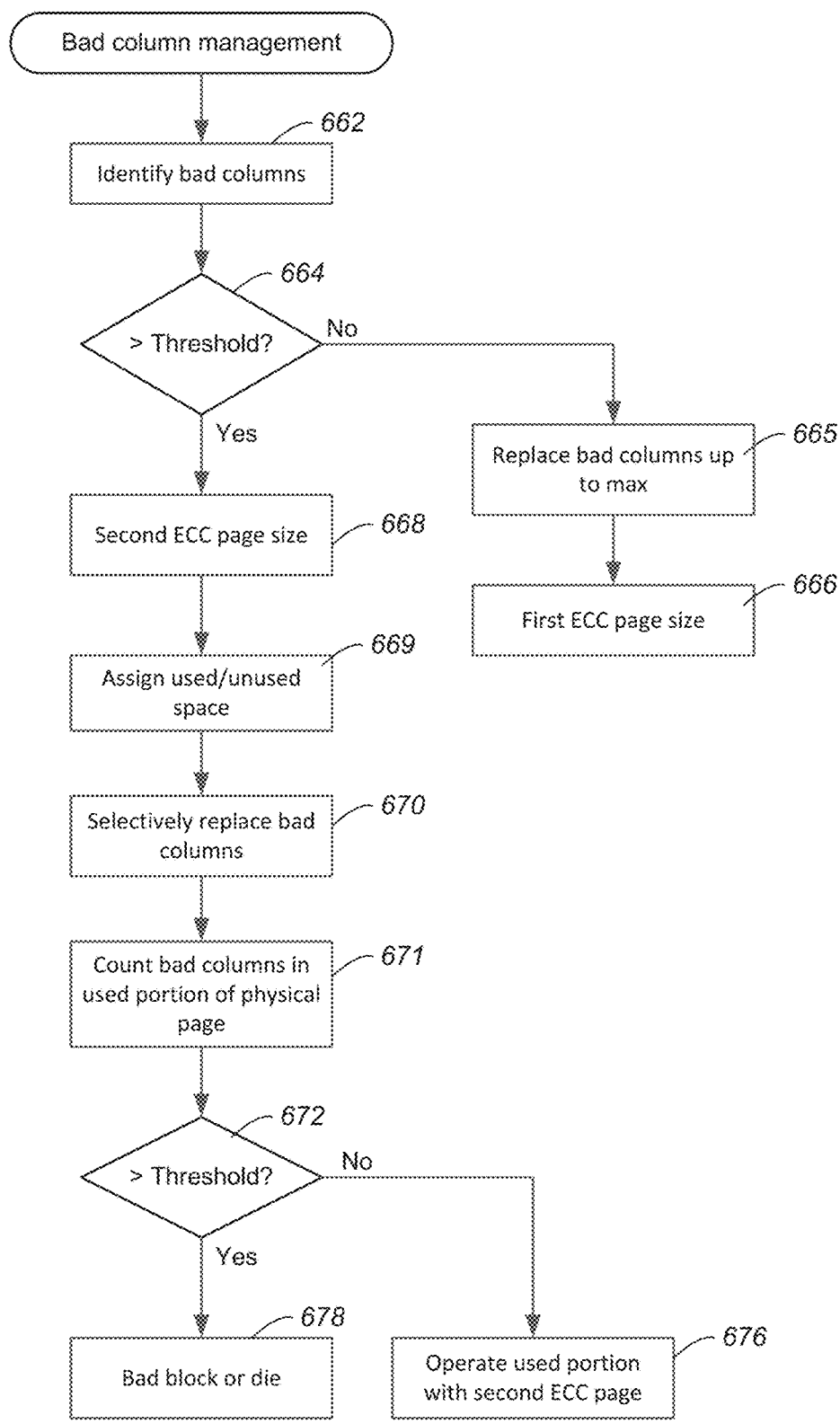
FIG. 16 illustrates an example of a scheme for bad column management.

FIG. 16 illustrates a scheme for bad column management in a nonvolatile memory. Bad columns are identified 662 and may be ranked according to the number of bad bit lines that they contain. The number of bad columns is compared 664 with a threshold number (e.g. a number somewhat larger than the number of replacement columns available). If the number of bad columns is not greater than the threshold number then bad columns are replaced 665 and an ECC scheme may be used with a first ECC page size 666. This may be a default scheme with a default ECC page size. If the number of bad columns is greater than the threshold number (e.g. greater than the number of replacement columns plus some number reflecting ECC correction capacity) then the scheme switches to a second ECC page size 668, which is smaller than the first ECC page size so that there will be some unused space in a page (i.e. unused columns). The unused space may be assigned 669 according to bad column locations and according to ranking of bad columns. Selective replacement of bad columns 670 may then be directed to areas that are assigned to be used. Then the number of unreplaced bad columns remaining in the used portion is determined 671. This number may be significantly lower than the total number of unreplaced bad columns (i.e. there may be a significant number of unreplaced bad columns in the unused areas). The number of bad columns remaining in the used portion is compared with another threshold number 672 (which may be different to the previous threshold number) to determine if the expected error rate is acceptable (considering the ECC correction capacity for data encoded using the second ECC page size). The number of bad bit lines (if known) rather than the number of bad columns may be used in this comparison. If the number of bad columns or bit lines does not exceed this threshold number then the used portions are operated using the second ECC page size (i.e. user data is encoded in the second page size and stored in physical pages that contain unused portions). Unused portions may be padded (e.g. dummy data may be written in unused portions). If the number of bad columns in the used portion is above the threshold number 672 then the block, or plane may be marked as bad 678 and may not subsequently be used.

Figure 17:
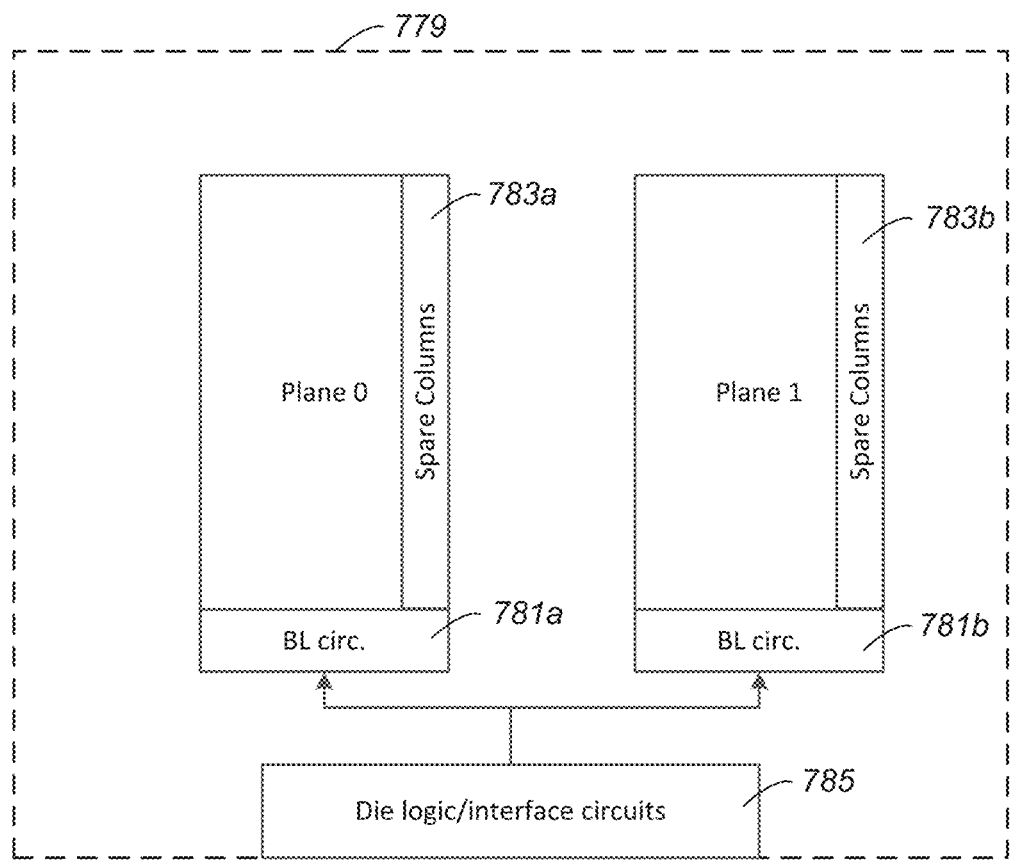
FIG. 17 illustrates an example of a memory die with column replacement.

Columns may be replaced in different ways. While the above examples illustrate various aspects on the scale of a physical page, it will be understood that a column may span many physical pages and that when a defective column is replaced it affects many pages. While the above examples show physical pages programmed with a single logical page of data (e.g. an SLC logical page) it will be understood that additional logical pages may be similarly programmed and that when a column is replace or skipped then it is replaced or skipped for all logical pages stored in a given physical page (and similar physical pages). FIG. 17 shows an example of a nonvolatile memory die 779 that includes two planes, Plane 0 and Plane 1. Each plane includes multiple blocks of memory (e.g. 3D NAND flash memory) that share a set of bit lines and associated bit line circuits "BL circ." 781a-b (e.g. bit line drivers, data latches, sense amps). In this example, spare columns 783a-b are provided in each plane (i.e. there are spare global bit lines that connect to vertical bit lines in each block of the plane, and these may be used to replace bad global bit lines in all blocks of the plane). For example, a plane may have about a hundred (e.g. 112) replacement columns and each replacement column may have sixteen global bit lines. In other examples, a bad column within a block may be replaced without replacing similar columns in other blocks (i.e. bad block replacement may be performed on a block-by-block basis). Die logic/interface circuits 785 on memory die 779 may be used to implement bad column replacement. For example, die/logic interface circuits 785 may redirect access to bad columns to redundant columns that replace the bad columns.

Figure 18:
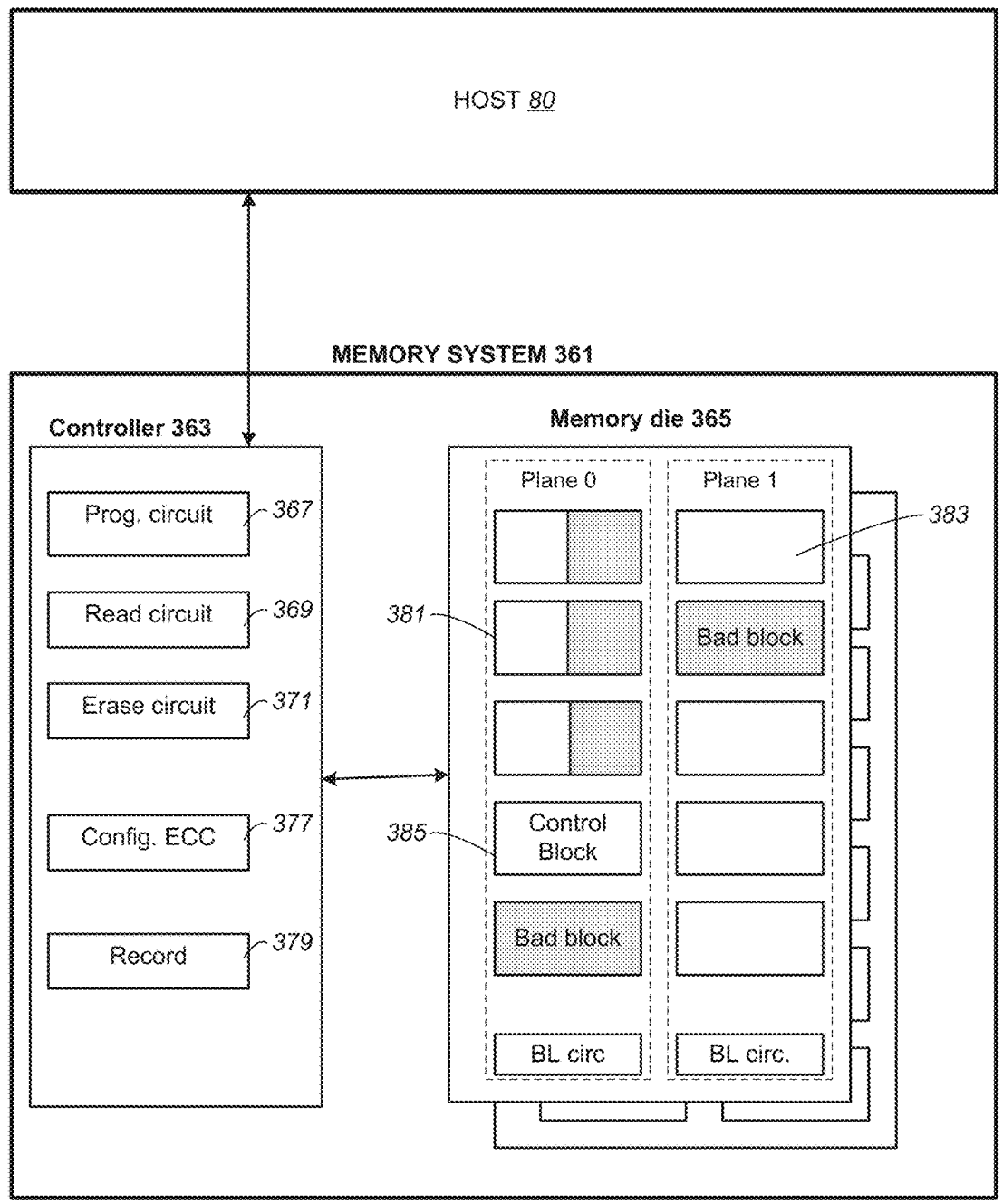
FIG. 18 illustrates an example of a nonvolatile memory system.

FIG. 18 shows an example of a memory system 361 that is in communication with a host 80. Memory system 361 may include multiple memory dies including memory die 365 and a memory controller 363. Memory die 365 includes two planes, Plane 0 and Plane 1, each with separate bit line circuits ("BL circ.") that control global bit lines for their respective planes. In Plane 0, block 381 has only half the user data storage capacity of a full block (illustrated by partial shading) such as block 383 because ECC page size is half that used for a full block. Control block 385 is used for control data and may be operated as an SLC block with a default page size. Controller 363 includes program circuit 367, read circuit 369, and erase circuit 371, which are used to access memory dies including memory die 365. A configurable ECC engine 377 provides encoding and decoding in at least two different ECC page sizes. A record 379 maintains a mapping of which blocks or planes use different page sizes. Thus, record 379 indicates which encoding and decoding scheme to use for data in different blocks. For example, record 379 may indicate that data should be encoded and decoded with smaller ECC page size for block 381 and larger ECC page size for control block 385 and block 383. Record 379 also indicates different user data storage capacities of different blocks. Thus, record 379 may indicate a user data storage capacity for block 381 that is half the user data storage capacity for block 383.

CONCLUSION

The foregoing detailed description has been presented for purposes of illustration and description. It is not intended to be exhaustive or to limit the attached claims. Many modifications and variations are possible in light of the above teaching.

It is claimed:

1. A method of operating a nonvolatile memory comprising: detecting a number of bad columns in the nonvolatile memory; comparing the number of bad columns detected by the detecting with a threshold number; if the number of bad columns is less than the threshold number then applying a first Error Correction Code (ECC) scheme to user data to be stored in the nonvolatile memory, the first ECC scheme encoding user data in first pages of a first size; and if the number of bad columns is greater than the threshold number then applying a second ECC scheme to user data stored in the nonvolatile memory, the second ECC scheme encoding user data in second pages of a second size that is smaller than the first size; wherein encoding according to the first ECC scheme adds a number of parity bytes per first page of user data and encoding according to the second ECC scheme adds the number of parity bytes per second page of user data.

2. The method of claim 1 wherein a page of the first size has twice as many bytes as a page of the second size.

3. The method of claim 2 wherein the first size is about two thousand bytes and the second size is about a thousand bytes.

4. The method of claim 1 wherein the first size is about two thousand bytes and the second size is about five hundred bytes.

5. The method of claim 1 further comprising, in response to the comparing, configuring a configurable ECC encoder/decoder unit that is connected to the nonvolatile memory to apply the first ECC scheme to user data if the number of bad columns is less than the threshold number and to apply the second ECC scheme to user data if the number of bad columns is greater than the threshold number.

6. The method of claim 5 further comprising, if the number of bad columns is greater than the threshold number, determining whether data to be stored is user data or control data, applying the second ECC scheme to user data, and applying the first ECC scheme to control data.

7. The method of claim 6 wherein control data is stored in single-level cell (SLC) format, with one bit per memory cell, and user data is stored in multi-level cell (MLC) format, with more than one bit per memory cell.

8. The method of claim 1 further comprising, if the number of bad columns is less than the threshold number, then assigning a first user data storage capacity to individual blocks of the nonvolatile memory; and
if the number of bad columns is greater than the threshold number, then assigning a second user data storage capacity to the individual blocks of the nonvolatile memory, the second user data storage capacity being smaller than the first user data storage capacity.

9. The method of claim 8 wherein the second user data storage capacity is about half as much as the first user data storage capacity.

10. A nonvolatile memory system comprising:
an array of nonvolatile memory cells, wherein the array of nonvolatile memory cells includes a plurality of individually erasable blocks, the plurality of individually erasable blocks including a first block of individually erasable memory cells and a second block of individually erasable memory cells, and wherein the first block has a first number of bad columns of memory cells and the second block has a second number of bad columns of memory cells, the second number being greater than the first number; and a configurable Error Correction Code (ECC) encoder/decoder that has at least a first mode and a second mode, the first mode encoding pages of a first size prior to storage in the array of nonvolatile memory cells and the second mode encoding pages of a second size prior to storage in the array of nonvolatile memory cells, the second size being smaller than the first size, wherein the encoder/decoder is configured to encode pages of user data in the first mode prior to storage in the first block and encode pages of user data in the second mode prior to storage in the second block; wherein encoding according to the first ECC scheme adds a number of parity bytes per first page of user data and encoding according to the second ECC scheme adds the number of parity bytes per second page of user data.

11. The nonvolatile memory system of claim 10 the plurality of individually erasable blocks includes a third block that stores control data, encoded in the first mode, in single-level cell (SLC) format, and a fourth block that that stores user data, encoded in the second mode, in multi-level cell (MLC) format.

12. The nonvolatile memory system of claim 11 wherein the third block contains pages of the first size stored with a predetermined number of parity bytes per page and the fourth block contains pages of the second size stored with the predetermined number of parity bytes per page.

13. The nonvolatile memory system of claim 11 wherein encoded control data stored in the third block occupies a first portion of memory cells along a written word line of the third block, wherein encoded user data stored in the fourth block occupies a second portion of memory cells along a written word line of the fourth block, wherein the second portion is less than the first portion.

14. The nonvolatile memory system of claim 13 wherein memory cells along the written word line of the fourth block that are not occupied by encoded user data are padded with dummy data.

15. The nonvolatile memory system of claim 10 further comprising a record that indicates a maximum number of defective columns in the array of nonvolatile memory cells that were identified as bad and are replaced or skipped, additional columns in the array of nonvolatile memory cells that were identified as bad remaining unrecorded and not replaced.

16. The nonvolatile memory system of claim 10 wherein the array of nonvolatile memory cells is a three dimensional array that is monolithically formed in one or more layers of memory cells disposed above a silicon substrate.

17. A method of operating a nonvolatile memory comprising: testing columns of the nonvolatile memory to detect bad columns; replacing bad columns up to a maximum replaceable number; comparing a number of unreplaced bad columns detected by the testing with a threshold number; if the number of unreplaced bad columns is less than the threshold number: applying a first Error Correction Code (ECC) scheme to user data to be stored in the nonvolatile memory, the first ECC scheme encoding data in pages of a first size; storing n encoded pages of the first size per word line; if the number of unreplaced bad columns is greater than the threshold number: applying a second ECC scheme to user data to be stored in the nonvolatile memory, the second ECC scheme encoding data in pages of a second size; and storing n encoded pages of the second size per word line; wherein encoding according to the first ECC scheme adds a number of parity bytes per first page of user data and encoding according to the second ECC scheme adds the number of parity bytes per second page of user data.

18. The method of claim 17 wherein storing the n encoded pages of the first size per word line uses substantially all memory cells of a first word line, storing the n encoded pages of the second size per word line does not use substantially all memory cells along a second word line, and further comprising programming the unused memory cells along the second word line with dummy data.

19. The method of claim 17 further comprising, if the number of unreplaced bad columns is greater than the threshold number, determining whether data to be stored in the nonvolatile memory is user data or control data, and applying the first ECC scheme to control data.

20. The method of claim 17 wherein the nonvolatile memory is a three dimensional memory that is monolithically formed in one or more physical layers of memory cells having active areas disposed above a silicon substrate, and wherein each bad column includes one or more horizontal bit lines, each horizontal bit line connected to a plurality of vertical bit lines.

\* \* \* \* \*